United States Patent [19]

Iida et al.

[11] Patent Number: 5,352,479
[45] Date of Patent: Oct. 4, 1994

[54] METHOD FOR FORMING AN ELECTRODE

[75] Inventors: Masaru Iida; Akihiro Konno, both of Funabashi; Michio Yamada, Matsudo, all of Japan

[73] Assignees: NFE Co., Ltd., Funabashi; Asahi Glass Company Ltd., Tokyo, both of Japan

[21] Appl. No.: 88,731

[22] Filed: Jul. 8, 1993

Related U.S. Application Data

[63] Continuation of Ser. No. 842,164, Mar. 31, 1992, abandoned.

[51] Int. Cl.$^5$ ............................................. B05D 5/12
[52] U.S. Cl. ...................... 27/96; 427/126.2; 427/126.3; 427/126.5; 427/126.6; 427/376.2; 427/376.6; 427/383.5; 427/404; 427/419.2
[58] Field of Search ............... 427/96, 126.2, 126.3, 427/126.5, 126.6, 376.2, 376.6, 383.5, 404, 419.2; 361/397

[56] References Cited

U.S. PATENT DOCUMENTS 4,407,847 10/1983 Boaz ................................. 427/126.2
4,503,090 3/1985 Brown et al. ..................... 427/126.2
4,975,301 12/1990 Andrews et al. ................. 427/126.2

FOREIGN PATENT DOCUMENTS 49-112162 10/1974 Japan.
57-15488 1/1982 Japan.

*Primary Examiner*—Shrive Beck
*Assistant Examiner*—Benjamin L. Utech
*Attorney, Agent, or Firm*—Oblon, Spivak, McClelland, Maier & Neustadt

[57] ABSTRACT

The present invention provides a method for forming an electrode, which comprises printing and drying on a glass substrate a thick film paste (a) having an inorganic powder containing an inorganic pigment as the main component, dispersed in an organic binder, then printing a thick film paste (b) having an inorganic powder containing a metal power and a glass powder as the main components, dispersed in an organic binder, to cover at least a part of said thick film paste (a), followed by baking at a temperature of from 400° to 800° C., and then removing (a) at the portion which is not covered by (b), to form an electrode which exhibits a desired color as observed from the side opposite to the printed side. According to the present invention, an electrode which exhibits a desired color as observed from the side of the glass substrate on which no electrode is formed, can be formed with excellent productivity.

5 Claims, 1 Drawing Sheet

METHOD FOR FORMING AN ELECTRODE

This application is a continuation of application Ser. No. 07/842,164, filed on Mar. 31, 1992, now abandoned.

TECHNICAL FIELD

The present invention relates to a method for forming a conductive circuit by printing a silver-type conductive paste on a glass substrate, followed by baking at a high temperature.

BACKGROUND ART

A technique of printing on a glass sheet a so-called thick film paste prepared by milling a silver powder with an organic binder, followed by baking at a temperature of from 400° to 800° C., is widely used for various industrial applications where a conductive circuit on a glass sheet is desired, such as glass panel heaters, antifogging circuit-provided window glass, automobile rear windows, electromagnetic wave-shielding glass and various electronic display tubes such as fluorescent display tubes.

When the glass surface is observed from the side opposite to the baked circuit side i.e. from the rear side, if a white or yellowish brown bright colored pattern distinctive from the background exists, the commercial value or appearance of the product is substantially impaired in many cases.

In such applications, there has been an increasing demand to make the color of the silver-type conductor circuit to be a desired color such as a dark color or a black color, and various attempts have been made in this respect.

For example, it has been attempted to incorporate various substances such as pigments in a silver-type thick film paste.

However, substances which can be incorporated to a silver-type thick film paste which is subjected to baking in air at a high temperature, are practically limited to metal oxides. Such metal oxides are insulators in most cases, and those which are comparable to silver in their electrical conductivity, are not industrially or economically readily available. Accordingly, it has been common that the function as a conductive thick film paste is substantially impaired even when the color can be made black by the incorporation of such a substance.

Further, it is conceivable to incorporate various noble metal powders to silver. However, no substance has been discovered which is capable of suppressing the color development of silver on a glass sheet and at the same time capable of maintaining the conductivity and the economical feasibility.

Further, a method is conceivable in which a separate thick film paste is preliminarily printed for the opacifying purpose, followed by printing the silver-type conductor. However, such a method is industrially difficult and lacks in the practical applicability or the economical feasibility especially for large-sized mass production products such as automobile rear windows.

DISCLOSURE OF THE INVENTION

The present invention relates to a technique for forming an electrode on a glass substrate by means of a conductive thick film paste, whereby it is intended to tint the electrode with e.g. a black color for the purpose of improving the colorful appearance of the opposite side (the rear side) of the printed surface.

In carrying out the present invention, the paste which is formed first on the glass substrate is required to be a substance which exhibits a desired color such as black after the reaction at a high temperature by baking together with a paste containing silver, which is printed thereon.

Further, it must be a substance which selectively reacts only with the paste containing silver, which is printed thereon and has a characteristic such that it is firmly bonded to the glass substrate only at such a selectively reacted portion and which satisfies also the requirements for durability and economical feasibility.

As a result of an earnest research for a substance satisfying these requirements, it has been found that as a paste which is formed firstly on the glass substrate, a paste containing no glass powder and having an inorganic powder containing an inorganic pigment as the main component, dispersed in an organic binder, is suitable and that in order to make the color of the opposite side of the printed surface black, a good result can be obtained by using as such an inorganic pigment for the paste, a copper oxide, a cobalt oxide or a double oxide thereof. The present invention has been accomplished on the basis of these discoveries.

Here, the present invention provides a method for forming an electrode, which comprises printing and drying on a glass substrate a thick film paste (a) having an inorganic powder containing an inorganic pigment as the main component, dispersed in an organic binder, then printing a thick film paste (b) having an inorganic powder containing a metal power and a glass powder as the main components, dispersed on an organic binder, to cover at least a part of said thick film paste (a), followed by baking at a temperature of from 400° to 800° C., and then removing (a) at the portion which is not covered by (b), to form an electrode which exhibits a desired color as observed from the side opposite to the printed side.

According to the present invention, the thick film paste (a) to be used, must be the one which secures the adhesion to the glass substrate of the conductive thick film paste (b) to be printed thereon and which at the same time can readily be removed at the portion where the thick film paste (b) has not been formed.

As a thick film paste (a) which is capable of accomplishing such an object, the one having an inorganic powder containing an inorganic pigment as the main component, dispersed in an organic binder, is preferred. There is no particular restriction as to the material of such an inorganic pigment for the thick film paste (a), and $CuO-Cr_2O_3$, $TiO_2$, $Fe_2O_3$, $CoO$, $Cr_2O_3$ or the like can be used. It may suitably be selected depending upon the desired color or the desired adhesion with the glass after heat treatment. Especially when it is desired to make the color of the opposite side of the printed surface black, the one containing a copper oxide, a cobalt oxide or an oxide containing both, as the main component, is preferred. Further, it is possible to obtain a desired color such as blue, green or red by properly mixing oxides of other elements such as Al, Zn, Mg, Sb, Ti and Fe, and CdS, CdSe, etc.

Particularly, as a copper oxide or a cobalt oxide to accomplish the main object of the present invention i.e. to make the color of the opposite side of the printed surface black, various copper oxides or double oxides with various metals, and various cobalt oxides or double oxides with various metals, are available. For example, in the case of a double oxide of copper, a spinel type or pyrochlore type oxide or its solid solution is preferred.

Particularly, the copper oxide and/or cobalt oxide, or a double oxide thereof, brings about excellent results also from the viewpoint of the adhesion of the thick film paste (b).

The mechanism for the formation of a conductive circuit having an adhesive strength only at the portion where the thick film paste (a) is covered with the thick film paste (b), is considered to be attributable to the fact that the thick film paste (b), particularly the glass powder therein is capable of being melted at a high temperature of from 400° to 800° C., and a part thereof penetrates through the thick film paste (a) to bond to the glass sheet for integration.

Further, if a copper oxide and/or cobalt oxide is used as an inorganic pigment for the thick film paste (a), it undergoes a certain specific reaction at a high temperature of from 400° to 800° C., whereby a particularly strong adhesive strength will be obtained.

The portion of the thick film paste (a) where no thick film paste (b) is formed, contains no glass powder. Therefore, even if heated at a temperature of from 400° to 800° C., the organic binder will evaporate, and the inorganic pigment will remain. Thus, the adhesion to the glass substrate is weak, and such a portion can be removed by e.g. washing with water.

To the thick film paste (a), a small amount of additives which are commonly used for thick film pastes, may be added in addition to the above inorganic pigment such as a copper oxide or a cobalt oxide.

As the organic binder, the one having a resin component commonly used for a thick film paste, such as an ethyl cellulose derivative or an acrylic resin, dissolved in an amount of from 5 to 40 wt % in a known solvent such as terpineol or butylcarbitol, may be employed.

The inorganic powder in the thick film paste (a) is contained preferably in an amount of from 5 to 80 wt % in the thick film paste (a) with a view to easy blendability with an organic binder or a suitable viscosity for printing the paste.

Printing of the thick film paste (a) is usually conducted by a screen printing machine, followed by drying to remove the solvent.

The drying temperature is usually from 50° to 150° C., and the time is usually from 5 to 20 minutes for adequate drying.

The thickness of the printed product after drying is from 0.1 to 50 μm, preferably from 1 to 10 μm.

If the thickness of the printed product is too thin, the color development of silver can not be suppressed. On the other hand, if it is too thick, the adhesive strength to the glass substrate deteriorates, or cracks are likely to result.

The thick film paste (b) is prepared by adding an inorganic powder having from 4 to 30 wt % of glass powder and a silver-containing metal powder mixed in an amount of from 40 to 85% by weight, to the same organic binder as used for the thick film paste (a).

If the glass powder in the inorganic powder in such a thick film paste (b) is less than 4 wt %, no adequate adhesion to the glass substrate will be obtained.

As the glass powder, most of those commonly used for silver-type thick film conductive pastes, such as lead borosilicate type, cadmium borosilicate type, zinc borosilicate type, lead borate and barium borosilicate, are useful.

As the metal powder in the thick film paste (b), silver, copper, palladium or the like may be used. However, from the viewpoint of conductivity, a metal powder containing at least 30 wt % of silver, is preferred.

The printing pattern of the thick film paste (a) may not necessarily be the same as the printing pattern of the thick film paste (b), and it may rather have a much wider surface area than the pattern of the thick film paste (b).

Thus, precise superposition printing is not required, and industrial production can be conducted by a common printing apparatus.

This is a basic element of the present invention, and a feature resides in that the baked portion of any excess thick film paste (a) beyond the finally necessary silver-type conductive circuit, can be easily removed in the subsequent step.

Namely, the portion of the thick film paste (a) where the thick film paste (b) is not overlaid, has no adhesive strength to the glass substrate and will completely be removed by simple treatment such as washing with water.

Whereas, with respect to the portion of the thick film paste (a) where the thick film paste (b) is overlaid, it is believed that the glass powder in the thick film paste (b) is melted during the baking at a temperature of from 400° to 800° C. and bonded to the glass substrate thereby to establish strong adhesion to the glass substrate.

This fact makes it possible that the thick film paste (a) may be preliminarily printed over a large area, and then a silver-type conductive thick film paste (b) may easily be overlaid on the thick film paste (a) by a conventional industrial printing technique in spite of the fact that the thick film paste (b) is applied in a fine pattern.

Yet, the portion of the printed product after the baking at a temperature of from 400° to 800° C. where the thick film paste (b) is not printed, can be removed quite easily by an economical method such as water washing treatment, so that only the silver-type conductor will remain.

Further, other than by water washing treatment, such a portion can readily be removed by air jetting or buffing.

The above-mentioned baking at a temperature of from 400° to 800° C. may be conducted simultaneously in a step for reinforcing treatment or bending treatment of the glass substrate.

Further, if the thick film paste (b) is printed over the thick film paste (a) so that a part thereof extends beyond the thick film paste (a), there will be formed, as observed from the opposite side of the printed surface, a portion where the thick film paste (a) is observed and a portion where the thick film paste (b) is directly observed. Using this technique, it is possible to form an electrode having a desired pattern by forming the thick film paste (a) in the desired pattern.

The glass substrate provided with an electrode of the present invention can be applied not only to the above-described single plate, but also to a laminated glass wherein another sheet of glass plate is laminated thereon with the side having an electrode disposed inside with an intermediate film interposed therebetween. In this case, as the thick film paste (a) of the present invention contains no glass frit, it can be formed in a thickness after the baking as thin as from 0.5 to 3 μm. Accordingly, when processed to form a laminated glass, there will be no residual bubbles due to inadequate deaeration. Further, when subjected to heat-bending with another glass plate overlaid, there will be no heat fusion, since no glass frit is contained. Thus, this is advantageous also from the viewpoint of the production of a laminated glass.

Further, it is also possible to print on the above-mentioned thick film paste (b), a thick film paste (c) having an inorganic powder containing an inorganic pigment as the main component, dispersed in an organic binder, which is the same or similar to the thick film paste (a), followed by baking and washing with water, to form an electrode which exhibits a color due to the thick film paste (c) when observed from the side on which such an electrode is formed. Therefore, by properly selecting the inorganic pigment for the thick film paste (c), it is possible to form an electrode which exhibits a desired color when observed either one of the side on which the electrode is formed and the opposite side.

The thick film paste (a) was screen-printed on a soda glass sheet by means of a 325 mesh screen of pattern 1 and dried in air at 150° C. for 15 minutes.

On this dried paste, a thick paste (b) was printed by means of a 325 mesh screen of pattern 2 and dried at 150° C. for 15 minutes. The obtained double printed product was baked at 650° C. for 10 minutes in a muffle furnace, and the printed glass plate thus obtained, was washed with tap water to completely remove the baked product of the thick film paste (a) other than the pattern 2, to obtain a finished product.

The results are shown in Table 1.

Further, Examples in which the type of the metal oxide in Example 1 was changed, are likewise shown in Table 1 as Examples 2 to 10 and Comparative Examples 1 and 2.

TABLE 1

| | Preparation of conductive circuits (numerical values represent wt %) | | | | | | |
|---|---|---|---|---|---|---|---|
| | Thick film paste (a) | | Thick film paste (b) | | Result (1) | | Result (2) |
| Example 1 | Cu,Cr | | Ag | 90 | Black | | O |
| | Double oxide | 10 | Lead borosilicate | 10 | 100% | | |
| Example 2 | Cu,Cr | | Ag | 90 | Black | | O |
| | Double oxide | 20 | Lead borosilicate | 10 | 100% | | |
| Example 3 | | | Ag | 90 | Blackish brown | | O |
| | CuO | 10 | Lead borosilicate | 10 | 100% | | |
| Example 4 | | | Ag | 90 | Black | | O |
| | CuO | 20 | Lead borosilicate | 10 | 100% | | |
| Example 5 | Cu,Cr | | Ag | 90 | Black | | O |
| | Double oxide | 20 | Lead borosilicate | 10 | 100% | | |
| Example 6 | Cu,Cr,Fe | | Ag | 85 | Black | | O |
| | Multiple oxide | 10 | Lead borosilicate | 15 | 100% | | |
| Example 7 | Cu,Cr,Mn | | Ag | 80 | Black | | O |
| | Multiple oxide | 10 | Pd | 10 | 100% | | |
| | | | Lead borosilicate | 10 | | | |
| Example 8 | | | Ag | 90 | Black | | O |
| | CuO | 10 | Lead borosilicate | 10 | 100% | | |
| Example 9 | Co,Al | | Ag | 90 | Blue | | O |
| | Double oxide | 10 | Lead borosilicate | 10 | 70% | | |
| Example 10 | CdS,CdSe | | Ag | 90 | Red | | O |
| | Multiple oxide | 10 | Lead borosilicate | 10 | 70% | | |
| Comparative Example 1 | | | Ag | 90 | Yellowish white | | O |
| | Nil | | Lead borosilicate | 10 | 0% | | |
| Comparative Example 2 | Cu,Cr | | Ag | 97 | Black | | X |
| | Doublele oxide | 10 | Lead borosilicate | 3 | 100% | | |

BEST MODE FOR CARRYING OUT THE INVENTION

Figure 1:
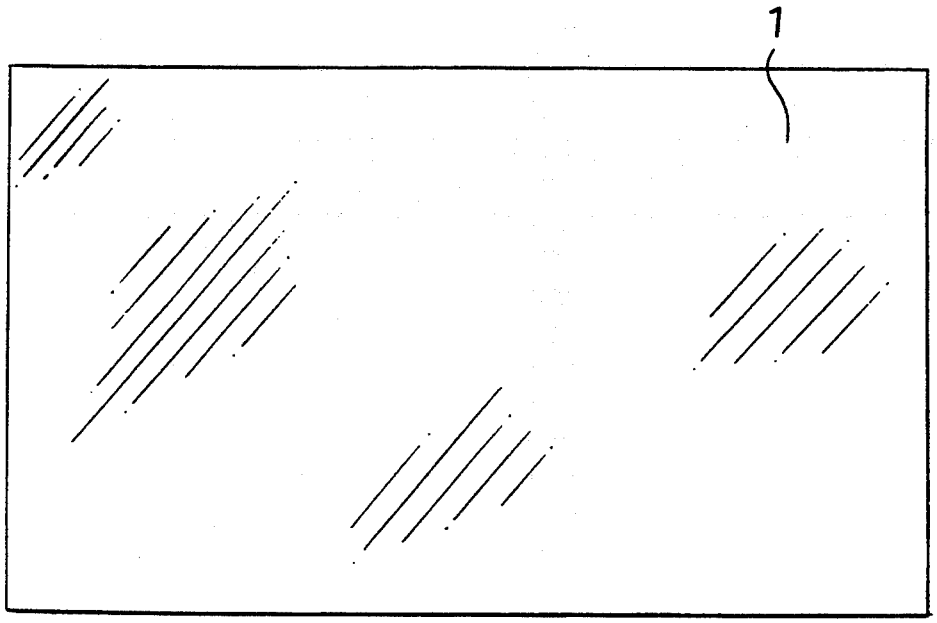
FIG. 1 is a plan view showing the shape of the paste-permeable portion of a screen used for printing the thick film paste (a) over the entire surface of a glass substrate in the Examples.
Figure 2:
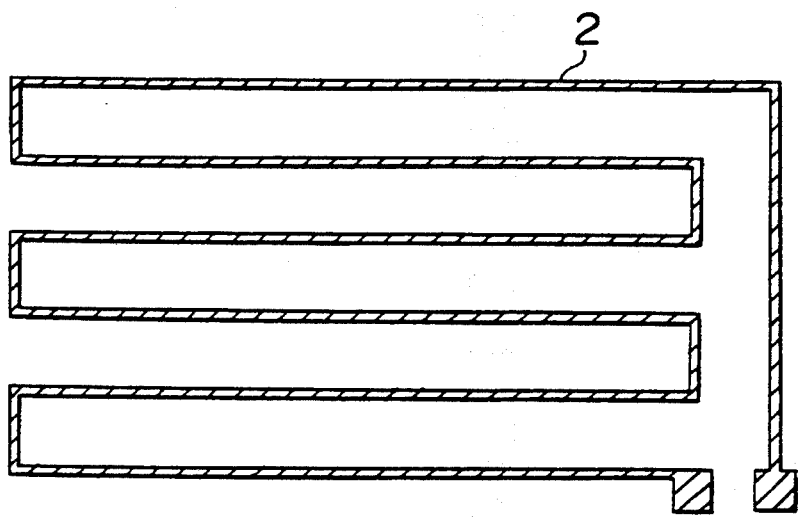
FIG. 2 is a plan view showing the shape of the paste-permeable portion of a screen used for printing a conductive circuit thereon by means of a thick film paste (b).

Now, the present invention will be described in further detail with reference to Examples.

Copper-chromium double oxide was added in a predetermined amount to 100 parts by weight of an α-terpineol solution containing 10 wt % of ethyl cellulose and mixed, and then the mixture was kneaded by a three-roll mill to obtain a thick film paste (a).

20 parts by weight of an α-terpineol solution containing 10 wt % of ethyl cellulose was added to a mixture comprising 90 parts by weight of silver powder and 10 parts by weight of lead borosilicate glass powder, and the mixture was kneaded by a three-roll mill to obtain a thick film paste (b).

Result (1) indicates the color observed from the rear side of the printed surface with the thick film paste, and the numerical value indicates the degree of shielding the developed color specific to Ag.

Result (2) indicates the test result of the adhesive strength to the glass substrate, whereby indicates satisfactory and X indicates unsatisfactory by an adhesive tape peeling test.

INDUSTRIAL APPLICABILITY

According to the present invention, an electrode exhibiting a desired color such as a black color as observed from the opposite side of the printed surface, can be formed under high productivity while maintaining the performance as the electrode. When this is applied to e.g. an automobile window glass provided with a conductive print for the purpose of antifogging, it is possible to form an electrode made of a conductive print having an improved design with a color such as a black color as observed from outside of the automobile, under extremely good productivity.

We claim:

1. A method for forming an electrode, which comprises printing and drying on a transparent glass substrate a first film paste containing no glass powder and having an inorganic powder containing an inorganic pigment, said inorganic powder being dispersed in an organic binder, then printing a second film paste having an inorganic powder containing a metal powder and a glass powder, said inorganic powder being dispersed in an organic binder, to cover a part of said first film paste, followed by baking at a temperature of from 400° to 800° C., and then removing the first film paste at the portion which is not covered by the second film paste, to form an electrode which exhibits a color as observed from the side opposite to the printed side.

2. The method for forming on electrode according to claim 1, wherein the inorganic pigment in the first film paste contains at least one member selected from the group consisting of copper oxides and cobalt oxides.

3. The method for forming an electrode according to claim 1, wherein the first film paste contains the inorganic powder in an amount of from 5 to 80 wt %.

4. The method for forming an electrode according to claim 1, wherein the metal powder in the second film paste is a metal powder containing silver in an amount of at least 30 wt %.

5. The method for forming an electrode according to claim 1, wherein the inorganic powder in the second film paste contains the glass powder in an amount of at least 4 to 30 wt %.

* * * * *

UNITED STATES PATENT AND TRADEMARK OFFICE
CERTIFICATE OF CORRECTION

PATENT NO. : 5,352,479
DATED : October 4, 1994
INVENTOR(S) : Masaru IIDA, et al.

It is certified that error appears in the above-indentified patent and that said Letters Patent is hereby corrected as shown below:

On the title page, Item [63], and in column 1, Lines 4 and 5, the Related U.S. Application Data should read:

--Continuation of Ser. No. 842,164, Mar. 31, 1992, filed as PCT/JP90/00978, Jul. 31, 1990, abandoned.--

Signed and Sealed this

Fourth Day of April, 1995

Attest:

BRUCE LEHMAN

*Attesting Officer*     *Commissioner of Patents and Trademarks*